(12) United States Patent
Negreira et al.

(10) Patent No.: US 9,418,834 B2
(45) Date of Patent: Aug. 16, 2016

(54) SYSTEM AND METHODS FOR SPIN-ON COATING OF SELF-ASSEMBLED MONOLAYERS OR PERIODIC ORGANOSILICATES ON A SUBSTRATE

(71) Applicant: Tokyo Electron Limited, Minato-ku, Tokyo (JP)

(72) Inventors: Ainhoa Romo Negreira, Leuven (BE); Kathleen Nafus, Leuven (BE); Yuhei Kuwahara, Leuven (BE); Koichi Matsunaga, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/570,865

(22) Filed: Dec. 15, 2014

(65) Prior Publication Data

US 2015/0170903 A1 Jun. 18, 2015

Related U.S. Application Data

(60) Provisional application No. 61/917,031, filed on Dec. 17, 2013.

(51) Int. Cl.
*H01L 21/027* (2006.01)
*H01L 21/02* (2006.01)
*H01L 21/3105* (2006.01)

(52) U.S. Cl.
CPC .... *H01L 21/02126* (2013.01); *H01L 21/02343* (2013.01); *H01L 21/02359* (2013.01); *H01L 21/3105* (2013.01)

(58) Field of Classification Search
None
See application file for complete search history.

(56) References Cited

U.S. PATENT DOCUMENTS

| | | | |
|---|---|---|---|
| 5,773,083 A | 6/1998 | Fischer et al. | |
| 6,391,800 B1 | 5/2002 | Redd et al. | |
| 6,784,120 B2 | 8/2004 | Davlin et al. | |
| 6,946,407 B2 | 9/2005 | Davlin et al. | |
| 2004/0238851 A1* | 12/2004 | Flores | H01L 21/7806 257/202 |
| 2005/0194661 A1 | 9/2005 | Whitman | |
| 2008/0317953 A1* | 12/2008 | Watkins | B01D 67/003 427/244 |
| 2014/0273476 A1* | 9/2014 | Cheng | B81C 1/00031 438/703 |

* cited by examiner

*Primary Examiner* — Asok K Sarkar

(57) ABSTRACT

This disclosure relates to a processing system for spin-coating a substrate with Molecular Self-assembly (MSA) chemicals to form photoresist films and/or low dielectric constant (low-k) films on the substrate. The spin-coating processing system may include a spin-coating chamber that can receive and spin-coat MSA chemicals onto the substrate and an annealing chamber to thermally treat the substrate after the spin-coat process. In certain embodiments, the spin-coating processing system may also pre-treat or pre-wet the substrate prior to the spin-coating process.

20 Claims, 7 Drawing Sheets

SYSTEM AND METHODS FOR SPIN-ON COATING OF SELF-ASSEMBLED MONOLAYERS OR PERIODIC ORGANOSILICATES ON A SUBSTRATE

CROSS REFERENCE TO RELATED APPLICATION

Pursuant to 37 C.F.R. §1.78(a)(4), this application claims the benefit of and priority to prior filed Provisional Application Ser. No. 61/917,031 filed Dec. 17, 2013, which is expressly incorporated herein by reference.

FIELD OF THE INVENTION

This invention relates to semiconductor processing technology, and more particularly, to systems and methods for spin-on coating of self-assembled monolayers and organosilicates on a substrate.

BACKGROUND OF THE INVENTION

Nanofabrication techniques for semiconductor devices, and the like, are pushing geometry features to smaller and smaller dimensions and using films with lower dielectric constants. Molecular self-assembly (MSA) techniques may be used to overcome geometry (e.g., photolithography) limitations by generating alternative resist materials that may extend the capability of photolithography techniques. Low dielectric constant films may also be generated by MSA techniques. MSA techniques enable molecules to form structures without external guidance or in a self-directed manner. In this way, pre-existing components (e.g., molecules) form an organized structure or pattern based on the interactions between the components and/or the substrate. In current approaches, MSA material formation may be accomplished by submerging substrates into a chemical bath to generate the monolayer. Low dielectric constant films may be formed using chemical vapor deposition (CVD) techniques. In these approaches, the cost of chemicals for these films may be costly based on the amount of chemicals and time needed to generate these films. Accordingly, any techniques that would reduce the amount of chemicals used to generate these films may be desirable.

SUMMARY OF THE INVENTION

This disclosure relates to a processing system for spin-coating a substrate with Molecular Self-assembly (MSA) chemicals to form photoresist films and/or low dielectric constant (low-k) films on the substrate. The spin-coating processing system may include a spin-coating chamber that can receive and spin-coat MSA chemicals onto the substrate and an annealing chamber to thermally treat the substrate after the spin-coat process. In certain embodiments, the spin-coating processing system may also pre-treat or pre-wet the substrate prior to the spin-coating process.

The spin-coating chamber may include a liquid delivery system that may dispense one or more chemicals onto a substrate in series or in parallel. The dispensed chemicals may be used to pre-treat the substrate prior to the dispensing of the MSA chemicals. The types of films that may be formed by the MSA chemicals may include, but are not limited to self-assembled mono-layers (SAMs) and organosilicates (e.g., periodic mesoporous organosilicates (PMO)). In summary, the SAMs and PMO may include monomolecular organic films that may have a thickness of less than 1 nm. The films may comprise a plurality of molecules designed to bond to the substrate and/or to each other in a particular or ordered manner. However, in certain instances, the substrate may be pre-treated to react with the MSA chemicals in a particular way or to facilitate the MSA coverage over the surface of the substrate.

In one SAM embodiment, a method for treating the substrate may include generating a hydroxide layer on a surface of the substrate to attract and bond with a portion of the SAM, such that the SAMs are oriented or bonded to the substrate in a particular manner. The system may also dispense a first solvent (e.g., PGMEA) to pre-wet the substrate to enable the MSA chemicals to flow more easily over the surface of the substrate. The first solvent may include an amount of water that is no more than 10% by weight of the solvent. In one specific embodiment, the amount of water may be less than 2% by weight of the solvent. In another embodiment, the substrate may be baked to remove moisture from the substrate prior to the dispensing of the first solvent. In certain instances, the pre-bake may be followed by or preceded by chilling or cooling the substrate prior to dispensing the first solvent.

In this embodiment, the system may include a rotation chuck that secures the substrate within the spin-coating chamber. The substrate may begin rotating following the application of the first solvent. The rotation speed may vary, depending upon the process, between 800 and 2200 revolutions per minute (rpm). In one specific embodiment, the rotation speed may be about 1000 rpm or about 2000 rpm. The system may dispense a patterning chemical (SAM) onto the substrate following the start of the substrate's rotation. The patterning chemical may include, but is not limited to, a SAM that comprises a carbon compound, a bonding compound coupled to the carbon compound, a terminal compound coupled to the carbon compound, and a second solvent solution. In one embodiment, the carbon compound may include a chain of carbon molecules that are coupled to each other to form thin mono-layer that is no more than 1 nm long. The terminal compound may be disposed at or near one end of the carbon compound and the bonding compound may be disposed at the opposite or opposing end of the carbon compound. The bonding compound may include any molecule or molecules that are more likely to bond with the substrate than the molecule(s) of the terminal compound. In one instance, the bonding compound molecule(s) may be more likely to be attracted to or bonded with the hydroxide interface on the substrate than the molecule(s) of the terminal compound. The dispensed amount of the patterning chemical may be of a sufficient amount to fully react with the surface of the substrate or cover the substrate, but prevent an agglomeration of the patterning chemical or creating particles by combining or bonding the SAMs to each other instead of the substrate. In one specific embodiment, the patterning chemical less than 0.5 mM of the carbon compound, bonding compound, and the terminal compound. In one embodiment, the first and the second solvent may be PGMEA, however the solvents are not required to be the same.

In this embodiment, the annealing may be done in the annealing chamber or module of the spin-coating system. The annealing or heat treatment may be implemented by thermal and/or radiative heating. For example, in one embodiment, the annealing module may include a heating element (e.g., bake plate) that may heat the substrate up to no more than 250C for five minutes. In one specific embodiment, the heating temperature may be about 200C for no more than five minutes. In another embodiment, the annealing module may include a light source (e.g., ultraviolet (UV) lamp) that may radiate the substrate with light radiation.

In the PMO embodiment, the method for spin-coating the MSA chemicals may be similar to the SAM method, except that the patterning chemical may be an organosilicate, such as a periodic mesoporous organosilicate. The PMO may include, but is not limited to, a silica compound and a surfactant compound that may self assemble to form an array of cylindrical organic structures.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. The substrate may include a round substrate with a diameter of at least 150 mm and may include, but is not limited to, the following elements: silicon, gallium, cadmium, or zinc.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
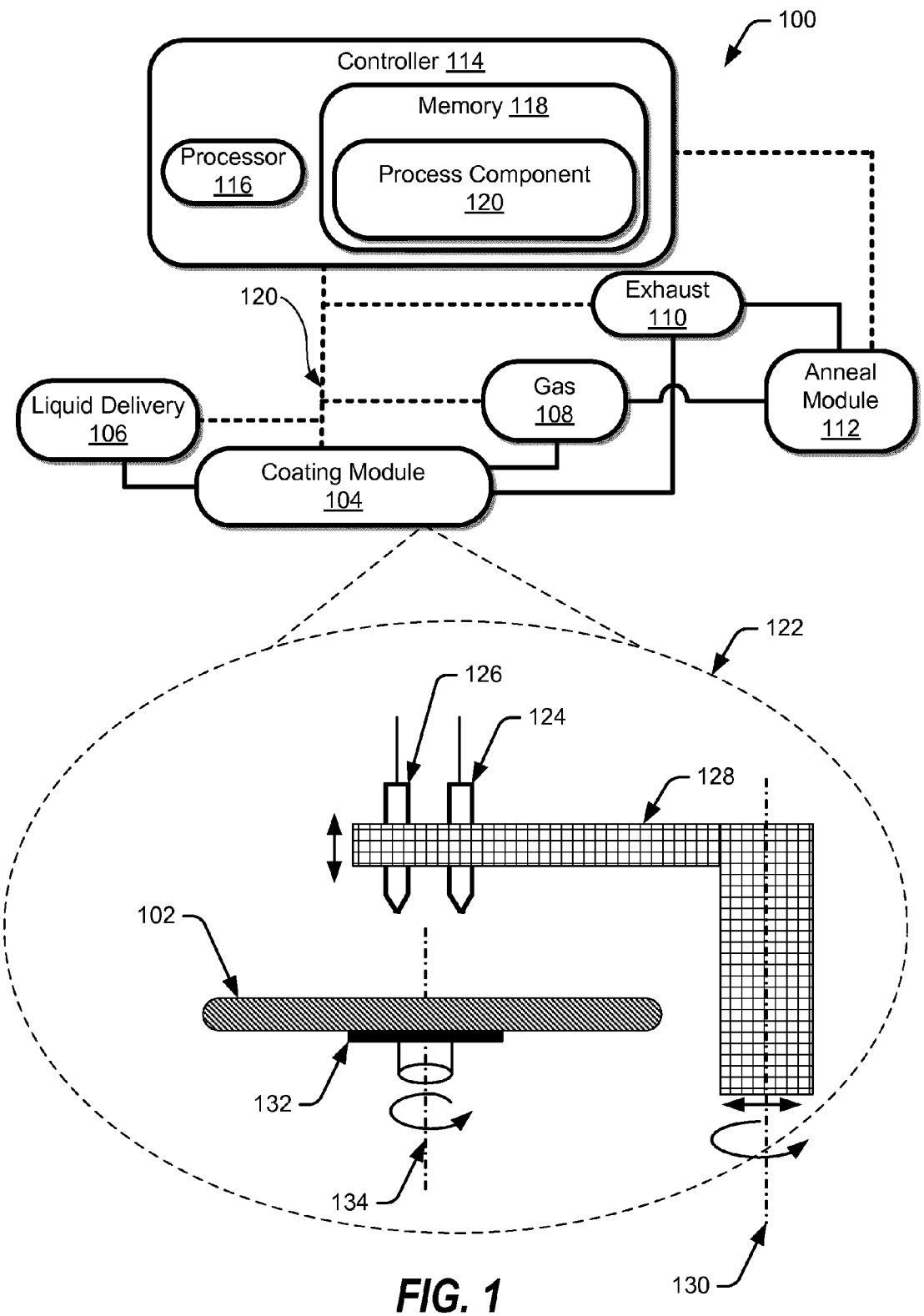
FIG. 1 is an illustration of a representative embodiment of a spin-coating processing system that includes a cross-section illustration of a coating module of the spin-coating processing system.

FIG. 1 depicts a spin-coating processing system 100 for dispensing chemicals onto a substrate 102 using a coating module 104 that is in fluid communication with a liquid delivery system 106 that may dispense one or types of liquid chemicals. The system 100 may also include a gas delivery system 108 that may provide gas to the coating module 104 that may be removed via an exhaust system 110. A liquid drain may also be incorporated into the exhaust system to remove liquids from the coating module 104. The system 100 may also include an anneal module 112 that may bake or apply light radiation to the substrate after the chemicals have been dispensed. A controller 114 may be used control the components of the system 100 using an electrical communication network 116 that may send or receive computer-executable instructions or electrical signals between the system 100 components. The controller 114 may include one or more computer processors 116 and memory components 118 that may store computer-executable instructions that may be executed by the computer processors or other logic/processing devices. The controller 114 may store recipe or process condition routines that may be implemented by controlling or directing the components of the system 100 to obtain certain conditions within the coating module 104 and/or the anneal module 112. Communication between the components may be implemented through processing and electrical communication techniques known to a person of ordinary skill in the art, as represented by the dashed lines 120.

The computer processors 116 may include one or more processing cores and are configured to access and execute (at least in part) computer-readable instructions stored in the one or more memories. The one or more computer processors 116 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The computer processor may also include a chipset(s) (not shown) for controlling communications between the components of the system 100. In certain embodiments, the computer processors may be based on Intel® architecture or ARM® architecture and the processor(s) and chipset may be from a family of Intel® processors and chipsets. The one or more computer processors may also include one or more application-specific integrated circuits (ASICs) or application-specific standard products (ASSPs) for handling specific data processing functions or tasks.

The memory 118 may include one or more non-transitory computer-readable storage media ("CRSM"). In some embodiments, the one or more memories may include non-transitory media such as random access memory ("RAM"), flash RAM, magnetic media, optical media, solid state media, and so forth. The one or more memories may be volatile (in that information is retained while providing power) or non-volatile (in that information is retained without providing power). Additional embodiments may also be provided as a computer program product including a non-transitory machine-readable signal (in compressed or uncompressed form). Examples of machine-readable signals include, but are not limited to, signals carried by the Internet or other networks. For example, distribution of software via the Internet may include a non-transitory machine-readable signal. Additionally, the memory may store an operating system that includes a plurality of computer-executable instructions that may be implemented by the processor to perform a variety of tasks to operate the plasma processing system 100.

FIG. 1 also includes a representative illustration 122 of one embodiment of the coating module 104 that may dispense chemicals onto the substrate 102. The system 100 may be used to dispense one or more liquid chemicals that may be distributed across the substrate be either rotating the substrate, translating the substrate, or rotating or translating the locations of the liquid dispensers. The liquid dispensers 124, 126, may disposed above the substrate 102 may be moved across or around to any position above or adjacent to the substrate 102 using the positioning mechanism 128. In the FIG. 1 embodiment, the positioning mechanism 128 may move forward and backward in a horizontal and/or vertical plane as indicated by the arrows adjacent to the positioning mechanism 128. The positioning mechanism 128 may also be rotated around the positioning mechanism's 128 vertical axis 130. The positioning mechanism 128 may dispense chemicals at discrete locations around the substrate 102 or they may be dispensed as the positioning mechanism 128 moves across the substrate 102. The chemicals may be disposed in a continuous or non-continuous manner onto the substrate. The chemicals may be dispensed one at a time in several movements across the substrate 102 or the chemicals may be dispensed at the same location, but at different times.

The substrate 102 may be secured to a rotating chuck 132 that supports the substrate and may rotate the substrate 102 during the chemical dispensing. The substrate 102 may be rotated around the rotation axis 134 with up to speeds of 2200 revolutions per minute (rpm). The chemical dispense may occur before, during, and/or after the substrate 102 starts to rotate.

Prior or after the chemical dispensing, the substrate 102 may be treated in the anneal module 112 that may heat the substrate up to remove moisture from the substrate 102 prior to the chemical dispensing or to treat the film deposited on the substrate 102 by the coating module 104. The anneal module 112 may include, but is not limited to, a resistive heating element (not shown) that transfers heat via conduction to the substrate 102. In another embodiment, the anneal module 112 may include a radiation source (not shown) that exposes the substrate 102 to radiation. The radiation source may include, but is not limited to, an ultraviolet light (UV) source (not shown). The anneal module 112 may also heat the substrate 102 via convection by receiving heated gas from the gas system 108. The anneal module 112 may also treat the substrate with relatively inert gases, with respect to the substrate 102 or deposited film, to prevent chemical reactions with the ambient or surrounding environment (e.g., oxygen, moisture, etc.). The gases may also be used to remove gas or fluid that is out-gassed from the deposited film during the anneal treatment. The out-gassed chemicals may be removed by the exhaust system 110 that that removes the gases from the anneal module 112.

Figure 2:
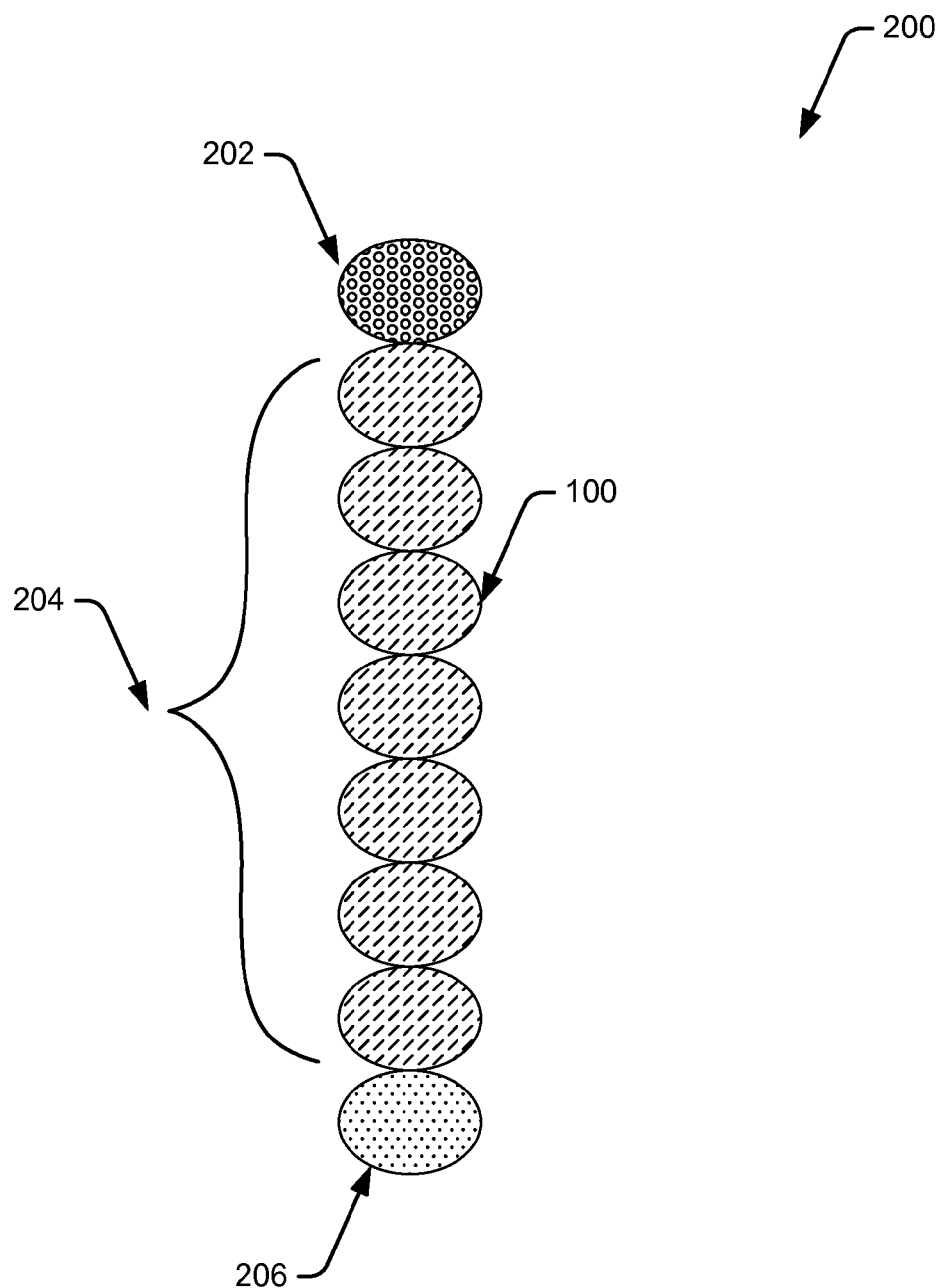
FIG. 2 is an illustration of a representative embodiment of a portion of a self-assembled mono-layer.

FIG. 2 is an illustration of a representative embodiment of a portion of a self-assembled mono-layer (SAM) 200 that may be formed on the substrate 102. The SAM 200 shown in FIG. 2 is intended for illustrative purposes to explain the components of the SAM. In application, the SAM 200 may be used with a plurality of SAMs 200 that arrange themselves in a systematic manner on the substrate 102 as will be described in the description of FIG. 4B. In brief, the SAMs 200 may form a three-dimensional crystalline or semi-crystalline structure from the surface of the substrate 102. The SAMs 200 may have a thickness of less than 1 nm.

The SAM 200 may include a terminal portion 202, a chain portion 204, and bonding portion 206. These portions may form the building blocks of the SAM 200 and that the interactions between these portions and the substrate 102 may form a three-dimensional structure. The molecular self-assembly may due to a combination of van der Waals interactions, hydrophobic interactions, and/or molecule-substrate interactions that form highly ordered low-dimensional structures spontaneously on the substrate 102 or overlying films (not shown).

Broadly, the bonding portion 206 may be coupled to or chemisorbed to the substrate 102. The bonding portion 206 may be chemically attracted to the substrate 102 or to a film or layer on the substrate 102, such as a hydroxyl (OH$^-$) layer. However, the terminal portion 202 and the chain portion 204 may be not be coupled to or chemisorbed into the substrate 102 or at least not coupled in the same way as the bonding portion 206. The chain portion 204 and the terminal portion 202, these building blocks, may assemble themselves as shown in FIG. 2. As a result of this selective assembly, the SAM 200 may appear to stand on end with the bonding portion 206 secured to the substrate 102 and the terminal portion 202 and chain portion 206 being tethered to the substrate via the bonding portion 206.

The SAM 200 may be used for a variety of applications and the composition of the portions, or building blocks, may vary depending on the desired structure and the type of substrate 102. For example, SAMs 200 may be used for, but are not limited to the following applications: control of wetting and adhesion, chemical resistance, bio compatibility, sensitization, molecular recognition for sensors, and/or nanofabrication. The areas of application may include, but are not limited to, biology, electrochemistry and electronics, nanoelectromechanical systems (NEMS) and microelectromechanical system (MEMS). For example, SAMs 200 may be used to control electron transfer in electrochemistry or to protect films (e.g., metals) from chemicals or etchants. SAMs 200 may also be used to reduce sticking of NEMS and MEMS components. The system 100 may be used to dispense chemicals for any SAM applications without limitation. In one embodiment, the SAM application may be to seal a porous film to prevent contamination of the film during subsequent processing treatments. For example, a low-k dielectric film in an electrical device may separate or electrically isolate metal layers from each other. However, if the metal layer is applied directly to the low-k film, the electro-plating process may diffuse into the porous low-k film. Diffusion of the metal into the low-k film will limit the electrical isolation capability of the low-k film. However, the SAM 200 may be applied to the low-k film to prevent shorting between the metal layers.

In one embodiment, the bonding portion 206 may include, but is not limited to, a $Si_xO_y$ molecule that may bond with the hydroxyl layer on the substrate 102. However, the bonding portion may be any reactive element that can bond or chemically react with the substrate 102. The chain portion 204 may include a chain of carbon elements 208 that are may be connected or bonded together. Although FIG. 2 illustrates one portion of the SAM 200, the chain portion 204 may be bonded with adjacent chain portions that may form the larger SAM structure (not shown in FIG. 2). The chain portion 204 may include $C_xH_y$ molecules that may be bonded together to form the three-dimensional structure of the SAM across the surface of the substrate 102. The terminal portion 202 may be assembled above the chain portion 204 and may be selected based on the application of the SAM. In one specific embodiment, the terminal portion 202 may include an amino group (e.g., $NH_x$) that may prevent water or other chemical from getting into the low-k film on the substrate 102.

In other embodiments, self-assembly techniques may be applied to non-SAM structures or chemicals that may include, but are not limited to organosilicates, such as periodic mesoporous organosilicates (PMO).

Figure 3:
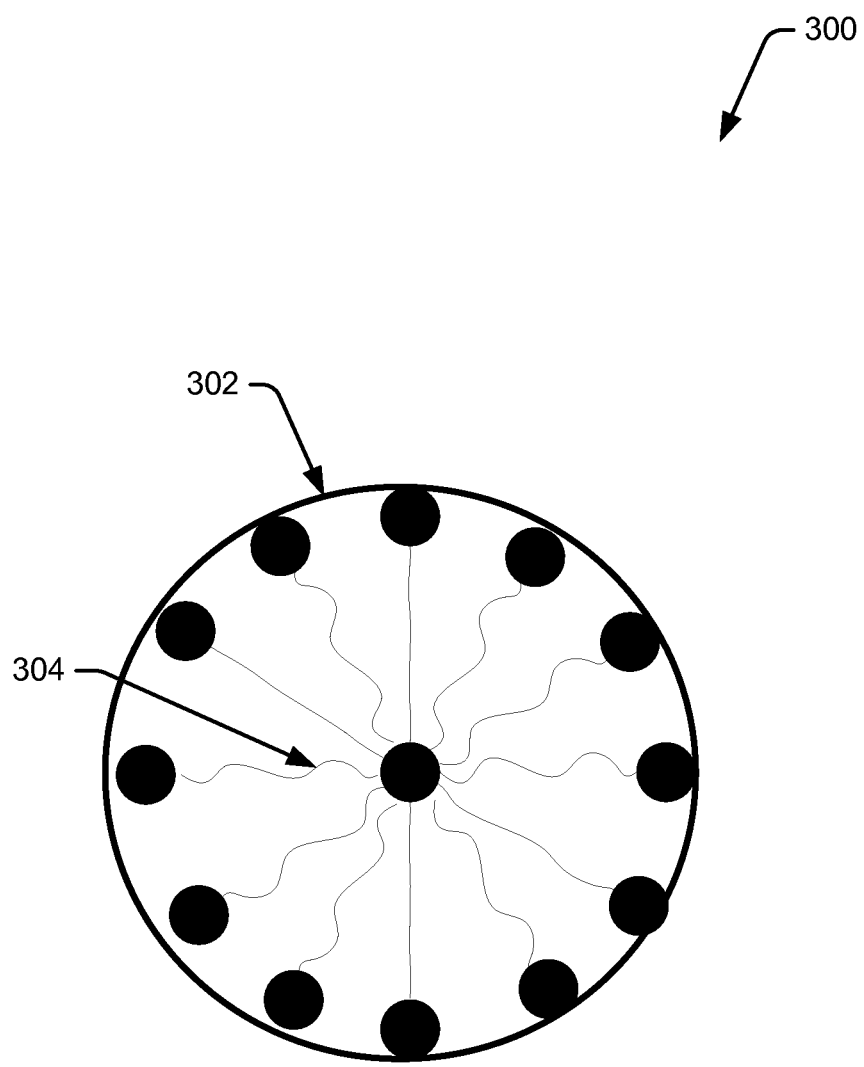
FIG. 3 is an illustration of a representative embodiment of a portion of a self-assembled PMO layer that includes the self-assembled silica and surfactant.

FIG. 3 is an illustration of a representative embodiment of a portion 200 of a self-assembled PMO layer that includes the self-assembled silica 302 and surfactant 304 prior to evaporation-induced self-assembly. The PMO portion 200 is illustrated for explanatory purposes and is not intended to represent a complete PMO layer, which is illustrated in FIG. 5B. However, this PMO portion 200 may be synthesized along with other PMO portions (not shown) to form a periodic structure that may be used to form low-k films on a substrate 102. The PMO layer may be periodically ordered with pores that may have a diameter of at least 2 nm. The periodic structure may be crystalline or amorphous in nature. A low-k film may be classified as a material with a low dielectric constant relative to silicon dioxide ($SiO_2$).

A layer (not shown) of PMOs 200 may include inorganic components bridged together by organic components to form a periodic or repeating structure on the substrate 102. The inorganic components may include, but are not limited to, polysilesquixanes that may include a silicon element and at least one oxygen element. The polysilesquixanes component may be represented by the formula $O_xSi$—R—$SiO_x$, where R may be the organic bridging group of the PMO. In this instance, the individual organic group may be covalently bonded to the silicon elements. In one specific embodiment, the silica 302 precursor chemical may include, but is not limited to, tetraethylorthosilica (TEOS).

In this embodiment, silica molecules 302 may form a ring around the surfactant molecule(s) 304. The silica 302 may include a silicon element and an oxygen element that may form the periodic structure of the PMO being influenced by a surfactant-mediated synthesis. For example, the surfactant may help form the structure and may be referred to as a structure directing agent that may include, but is not limited to, binary mixtures which may be cationic surfactants or anionic surfactants. In one specific embodiment, the structure directing agent may include long chain alkytrimethylammonium halides.

Figure 4A:
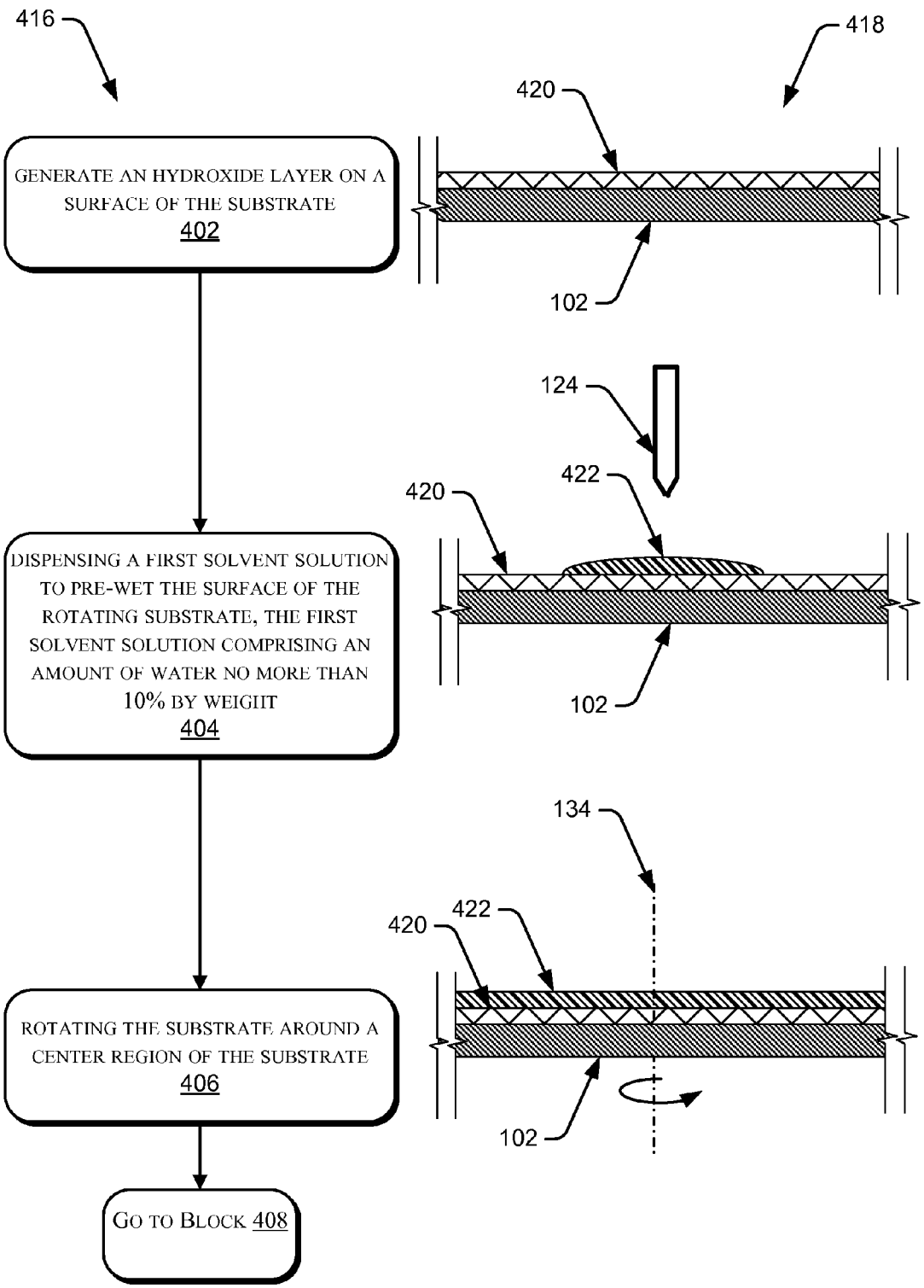
FIGS. 4A-4B illustrates flow diagrams and accompanying figures that describe the methods for the SAM embodiment.
Figure 4B:
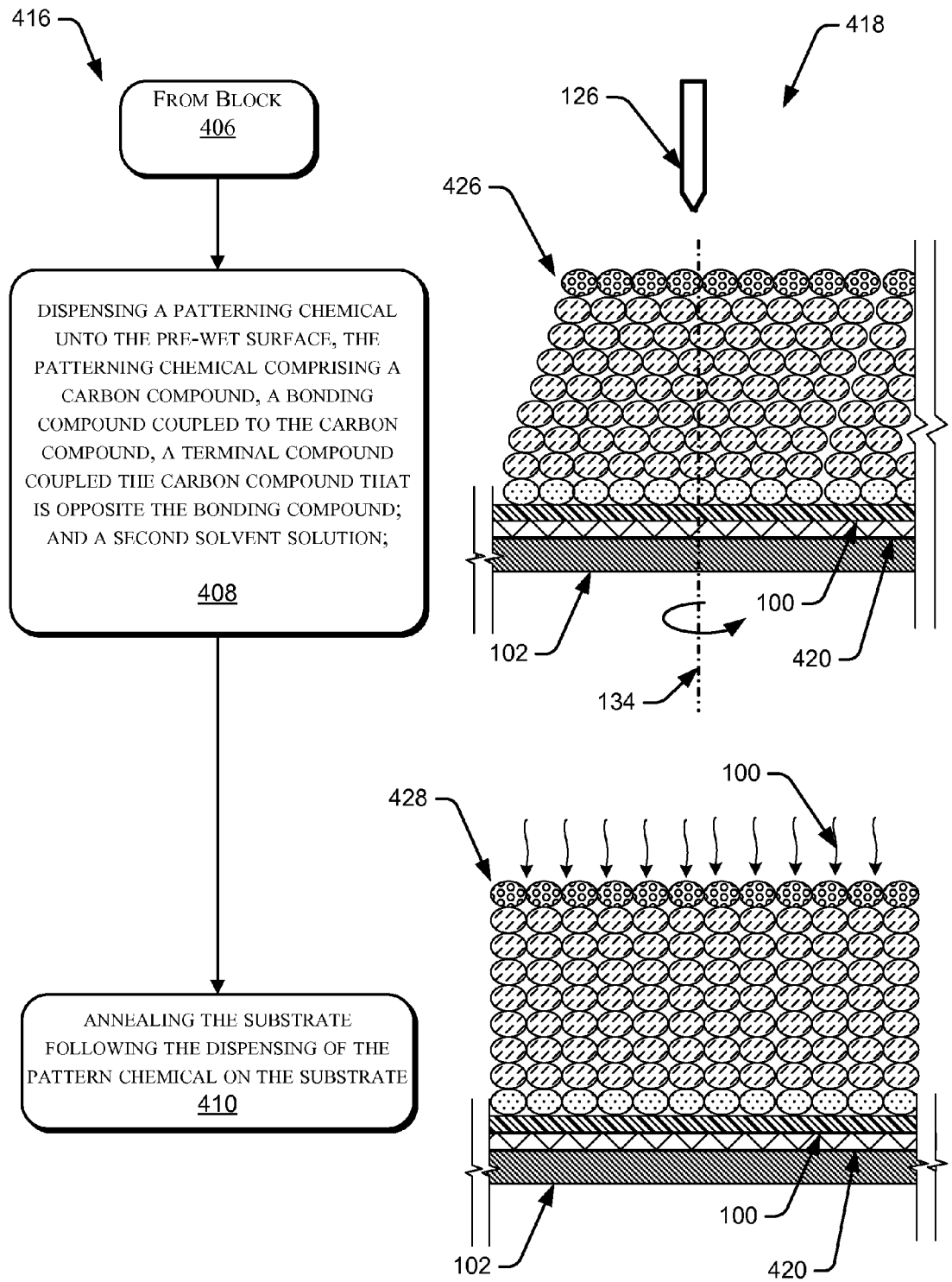

FIGS. 4A-4B illustrates a flow diagram 416 and accompanying figures 418 that describe the method for the SAM embodiment and the PMO embodiment. Broadly, the FIGS. 4A-4B method may use a pre-wetting technique to prepare the substrate 102 or an overlying film to receive the SAM chemical. The method may be used to enable the deposition of the SAM chemicals onto the substrate 102 using a spin-on technique. The pre-wetting technique may enable a lower defect level that was not previously possible.

In block 402, the coating module 104 may receive the substrate 102 that may include a hydroxide layer 420 on the surface of the substrate 102. The hydroxide layer 420 may be generated by applying a cleaning solution, ozone treatment, or a plasma process (e.g., $CO_2$, $O_2$) that may not be implemented by the chemical dispense system 100. However, in other embodiments, the system 100 may heat or prebake the substrate 102 and hydroxide layer 420 or may be configured to chill or cool the substrate 102 prior to dispensing chemicals onto the substrate 102.

In block 404, the coating module 104 may dispense a first solvent solution 422 to pre-wet the surface of the substrate 102. In one embodiment, the first solvent solution 422 may be dispensed from a first dispense nozzle 124. The first solvent solution 422 may include, but is not limited to, a solvent solution comprising an amount of water no more than 10% by weight. In one specific embodiment, the first solvent solution 422 the amount of water may be no more than 2% by weight. For example, the first solvent solution 422 may be propylene glycol monomethyl ether acetate (PGMEA).

The first solvent solution 422 may be dispensed onto the center of the substrate 102. In one embodiment, the substrate 102 may not be rotating during the application of the first solvent 422. However, in other embodiments, the substrate 102 may be rotating during the application of the first solvent 422. In the FIG. 4A embodiment, the first solvent solution 422 is applied while the substrate is not rotating.

In block 406, the coating module 114 may rotate the substrate 102 to distribute the first solvent 422 across the surface of the substrate as shown in the corresponding illustration to block 406. In the FIG. 4A embodiment, the substrate 102 may be rotated around the rotation axis 134. In this way, the uniformity of the first solvent solution 422 may have a uniformity of no more than 2% using up to a 10 mm edge exclusion.

The rotating speed may vary between 800 rpm up to 2200 rpm to generate a uniform layer that wets the surface of the substrate 102. In one specific embodiment, the rotation speed may be about 1000 rpm to achieve the uniform distribution of the first solvent 422. However, the first solvent may vary with respect to water concentration, as noted above. In this case, the rotation speed may be about 2000 rpm.

In block 408, the coating module 104 may dispense a patterning chemical unto the pre-wet surface of the substrate 102. The patterning chemical may be used to enable the formation of a monolayer on the substrate 102. The patterning chemical 426 may include a carbon compound, a bonding compound coupled to the carbon compound, and a terminal compound coupled the carbon compound that may be opposite the bonding compound. The patterning chemical may also include a second solvent that may be PGMEA, but is not required to be PGMEA. The amount of the patterning chemical that is dispensed should enable at least a majority of the substrate to be covered by the patterning chemical 426. In one specific embodiment, the amount of patterning chemical should be enough to react with at least a majority of the hydroxide 420 sites on the substrate 102. In another specific embodiment, the amount of the patterning chemical comprises less than 0.5 mM of the carbon compound, the bonding compound, and the terminal compound.

The substrate 102 may continue to rotate during the application of the patterning chemical 426. The substrate 102 rotation may vary between 800 rpm and 2200 rpm during the patterning chemical 426 dispensing.

In one embodiment, the bonding portion 206 may include, but is not limited to, a $Si_xO_y$ molecule that may bond with the hydroxyl layer on the substrate 102. However, the bonding portion may be any reactive element that can bond or chemically react with the substrate 102. The chain portion 204 may include a chain of carbon elements 208 that are may be connected or bonded together. Although FIG. 2 illustrates one portion of the SAM 200, the chain portion 204 may be bonded with adjacent chain portions that may form the larger SAM structure as shown in FIG. 4A. The chain portion 204 may include $C_xH_y$ molecules that may be bonded together to form the three-dimensional structure of the SAM across the surface of the substrate 102. The terminal portion 202 may be assembled above the chain portion 204 and may be selected based on the application of the SAM. In one specific embodiment, the terminal portion 202 may include an amino group (e.g., $NH_x$) that may prevent water or other chemical from getting into the low-k film on the substrate 102. In one specific embodiment, the SAM 200 may include Diethyleneamine (DETA) that may have a molecular weight of about 103.

In block 410, the substrate 102 may be moved from the coating module 104 to the annealing module 112 that may include a resistive heating element or a radiation source (e.g., UV light). The annealing temperature may be no more than 250C and may be applied for no more than 5 minutes to treat the patterning chemical. The annealing may enable the self-assembly of the components on the substrate 102. In other embodiments, the substrate 102 may be removed from the system 100 and annealed in a separate tool (e.g., bake oven, furnace, etc.).

In one embodiment, the anneal may enable or improve the self-assembly of the characteristics of the patterning chemical 426 to form the SAM layer 428 that is ordered across the surface of the substrate 102. In particular, the alignment of the SAM layer 428 may be improved from the previous dispense state illustrated by the patterning chemical 426 associated with block 406.

The characteristics of the SAM layer 428 may include on or more of the following characteristics: uniform thickness distribution across the wafer within the range of the thickness of one monolayer and a uniform water contact angle appropriate to the terminal group of the SAM. In one embodiment, this would include a uniform thickness of 0.88 nm and a uniform water contact angle of 48 degrees.

Figure 5A:
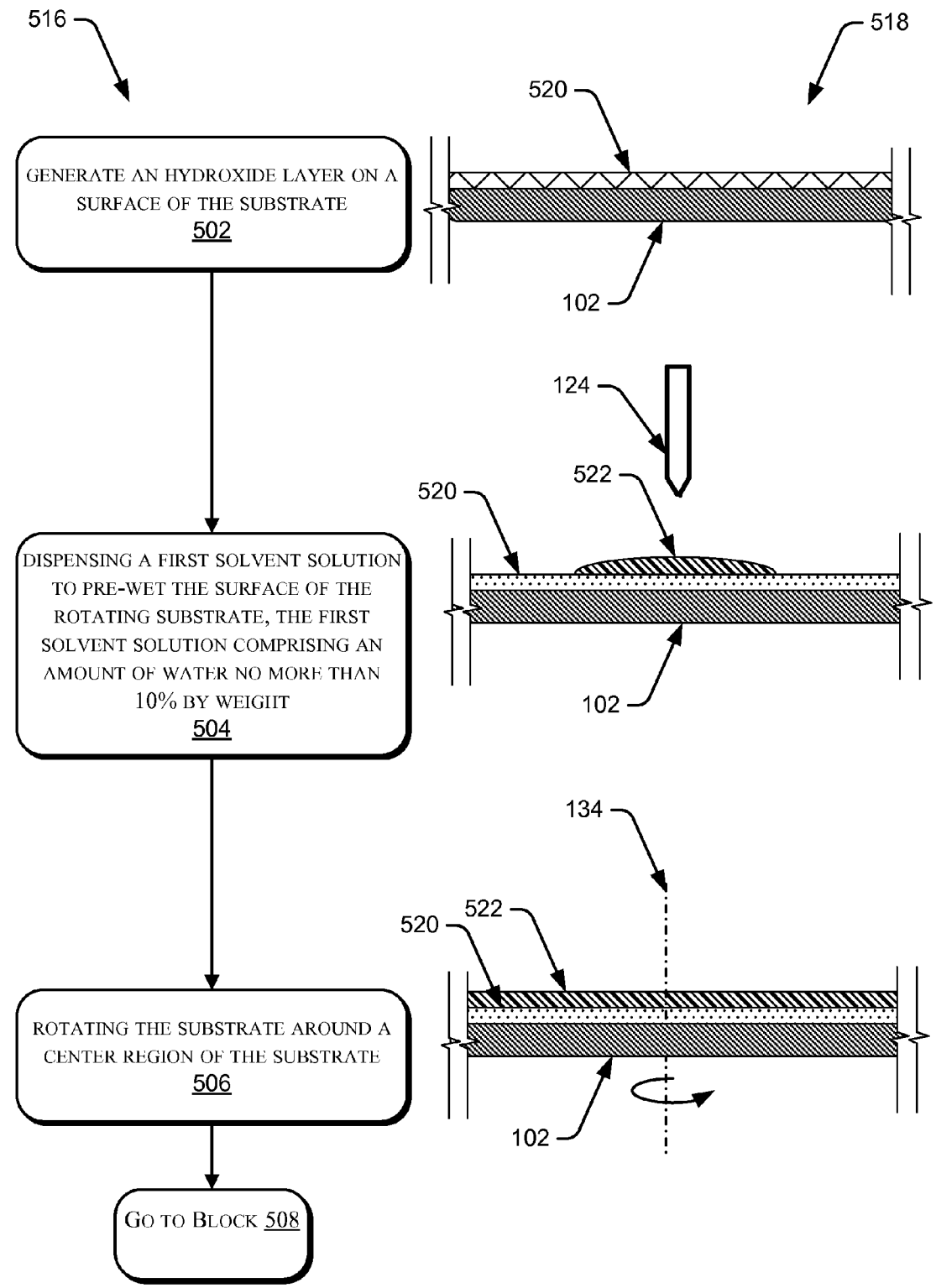
FIGS. 5A-5B illustrates flow diagrams and accompanying figures that describe the methods for the PMO embodiment.
Figure 5B:
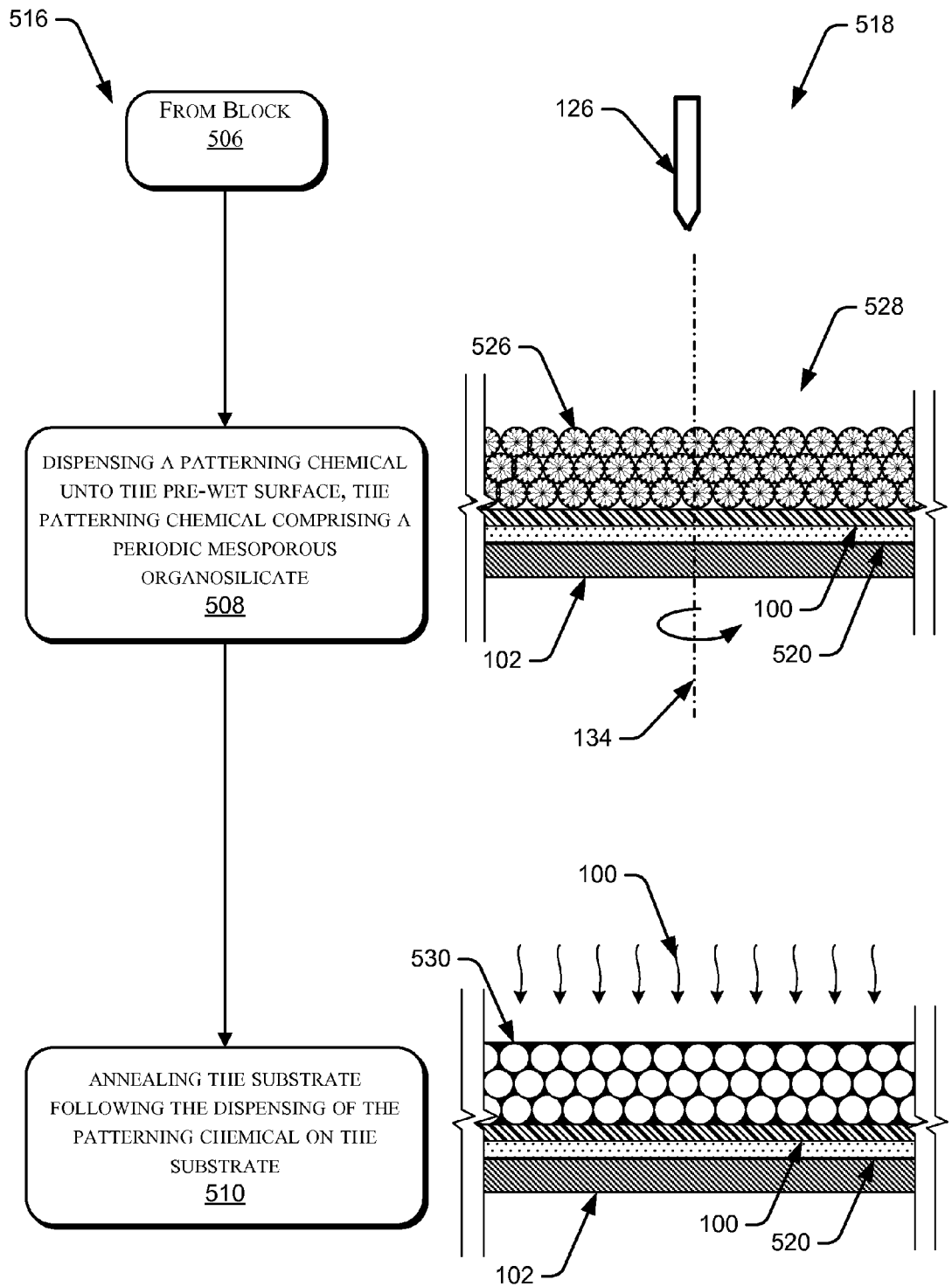

FIGS. 5A-5B illustrates a flow diagram 516 and accompanying figures 518 that describe the method for the PMO embodiment. The FIG. 5A-B method may include a pre-wetting technique to prepare the substrate 102 or an overlying film to receive the PMO chemical.

In block 502, the coating module 104 may receive the substrate 102 that may include a barrier layer 520 on the surface of the substrate 102. The barrier layer 520 may include, but is not limited to, Ta/$Ta_xN$ or any other materials that may be used to prevent chemicals from permeating a low-k dielectric layer, such as PMO. In other embodiments, the system 100 may heat or prebake the substrate 102 and barrier layer 520 or may be configured to chill or cool the substrate 102 prior to dispensing chemicals onto the substrate 102.

In block 504, the coating module 104 may dispense a first solvent solution 522 to pre-wet the surface of the substrate 102. In one embodiment, the first solvent solution 522 may be dispensed from a first dispense nozzle 124. The first solvent solution 522 may include, but is not limited to, a solvent solution comprising an amount of water no more than 10% by weight. In one specific embodiment, the first solvent solution 522 the amount of water may be no more than 2% by weight. For example, the first solvent solution 522 may be propylene glycol monomethyl ether acetate (PGMEA). The first solvent 522 may reduce irregularities on the surface of the substrate 102 that may cause reduced adhesion of the PMO layer or defects at the interface between substrate 102 and the subsequent PMO layer.

The first solvent solution 522 may be dispensed onto the center of the substrate 102. In one embodiment, the substrate 102 may not be rotating during the application of the first solvent solution 522. However, in other embodiments, the substrate 102 may be rotating during the application of the first solvent solution 522. In the FIG. 4A embodiment, the first solvent solution 522 is applied while the substrate is not rotating.

In block 506, the coating module 114 may rotate the substrate 102 to distribute the first solvent 522 across the surface of the substrate as shown in the corresponding illustration to block 506. In the FIG. 5A embodiment, the substrate 102 may be rotated around the rotation axis 134. In this way, the uniformity of the first solvent solution 522 may have a uniformity of no more than 2% using up to a 10 mm edge exclusion.

The rotating speed may vary between 800 rpm up to 2200 rpm to generate a uniform layer that wets the surface of the substrate 102. In one specific embodiment, the rotation speed may be about 1000 rpm to achieve the uniform distribution of the first solvent solution 522. However, the first solvent may vary with respect to water concentration, as noted above. In this case, the rotation speed may be about 2000 rpm.

In block 508, the coating module 104 may dispense a patterning chemical 526 unto the pre-wet surface of the substrate 102. The patterning chemical 526 may be used to enable the formation of a PMO layer 528 on the substrate 102. The patterning chemical 526 may include a silica component 302 and a surfactant component 304 that may be used to form a periodic structure as shown in FIG. 5A in the illustration adjacent to block 508. In one specific embodiment, the patterning chemical 526 may include a periodic mesoporous organosilicate. The silica component 302 may be self-assembled around one or more surfactant components 304 in a periodic manner, as described in the description of FIG. 3. The self-assembled structure 528 may include two or more layers of the periodic structure above the substrate 102.

In one embodiment, the substrate 102 may continue to rotate during the application of the patterning chemical 426. The substrate 102 rotation may vary between 800 rpm and 2200 rpm during the patterning chemical 426 dispensing.

In one embodiment, the characteristics of the PMO layer 428 may include one or more of the following characteristics: a refractive index of about 1.28, a young's modulus of about 6 GPa, a hardness of 0.5 GPa, a mean pore radius of 1.4 nm, a porosity of about 37% to 41%, and/or a K-value of no more than 2.5.

In block 510, the substrate 102 may be moved to the annealing module 112 to evaporate the surfactant from the self-assembled structure 528 to form the PMO layer 530 that may form a low-k layer to isolate metal lines (not shown) from each other in a semiconductor device (not shown). In this process, the assembly of the self-assembled structure 528 may vary according to the evaporation rate. Therefore, the temperature and time for the anneal or heat treatment may vary. In one embodiment, the anneal temperature may be no more than 250C for no more than 5 minutes.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate, comprising:
   receiving the substrate in a chemical dispensing system, the substrate comprising an hydroxide layer on a surface of the substrate;
   dispensing a first solvent solution to pre-wet the surface, the first solvent solution comprising an amount of water no more than 10% by weight;
   rotating the substrate, after dispensing the first solvent solution, around a center region of the substrate;
   dispensing a patterning chemical onto the pre-wet surface while rotating the substrate, the patterning chemical comprising:
      a carbon compound;
      a bonding compound coupled to the carbon compound;
      a terminal compound coupled to the carbon compound that is opposite the bonding compound;
      a second solvent solution;
   annealing the substrate following the dispensing of the pattern chemical on the substrate.

2. The method of claim 1, wherein the bonding compound comprises a $Si_xO_y$ molecule, the carbon compound comprises a $C_xH_y$ molecule, and the terminal compound comprises an amino group (NHx).

3. The method of claim 1, further comprising:
   prebaking the substrate prior to dispensing the first solvent; or
   chilling the substrate prior to dispensing the first solvent.

4. The method of claim 1, wherein the dispensing of the patterning chemical comprises an amount to bond with more than a majority of the hydroxide layer.

5. The method of claim 1, wherein the patterning chemical comprises less than 0.5 mM of the carbon compound, bonding compound, and the terminal compound.

6. The method of claim 1, wherein the first solvent comprises propylene glycol monomethyl ether acetate (PGMEA), and the second solvent solution comprises PGMEA.

7. The method of claim 1, wherein the first solvent comprises propylene glycol monomethyl ether acetate (PGMEA), and the second solvent solution comprises water no more than 2% by weight.

8. The method of claim 1, wherein the annealing comprises a temperature no more than 250C.

9. The method of claim 8, wherein the annealing comprises a time of no more than 5 minutes.

10. The method of claim 8, wherein the annealing comprises a time of about 5 minutes.

11. The method of claim 1, wherein the rotating comprises a rotation speed of no more than 2200 rpm.

12. The method of claim 1, wherein the rotating comprises a rotation speed of no less than 800 rpm.

13. The method of claim 1, wherein the rotating comprises a rotation speed of about 2000 rpm.

14. The method of claim 1, wherein the rotating comprises a rotation speed of about 1000 rpm.

15. The method of claim 1, wherein the amount of water comprises no more than 2% by weight.

16. The method of claim 1, wherein the patterning chemical comprises Diethyleneamine.

17. A method for treating a substrate, comprising:
   receiving the substrate in a spin-coating system, the substrate comprising a barrier layer comprising Tantalum;
   dispensing a first solvent solution to pre-wet the surface of the substrate, the first solvent solution comprising an amount of water no more than 10% by weight;
   rotating the substrate around a center region of the substrate;
   dispensing an organosilicate, using the spin-coating system, onto the pre-wet surface;
   forming a dielectric layer on the substrate using the organosilicate; and
   applying a metal layer to the dielectric layer.

18. The method of claim 17, wherein the rotating comprises a rotation speed of no less than 800 rpm.

19. The method of claim 17, wherein the annealing comprises a temperature no more than 250C.

20. A method for treating a substrate, comprising:
   receiving the substrate in a spin-coating system, the substrate comprising an hydroxide layer on a surface of the substrate;
   dispensing a first solvent solution to pre-wet the surface in the spin-coating system, the first solvent solution comprising an amount of water no more than 10% by weight;
   rotating the substrate, after dispensing the first solvent solution, around a center region of the substrate; and
   dispensing a organosilicate onto the pre-wet surface while rotating the substrate in the spin-coating system.

* * * * *